United States Patent
Pham et al.

(10) Patent No.: US 6,532,559 B1
(45) Date of Patent: Mar. 11, 2003

(54) METHOD AND APPARATUS FOR TESTING A CIRCUIT

(75) Inventors: Chung V. Pham, Austin, TX (US); Paul J. Hooper, Round Rock, TX (US); Mark A. Miller, Austin, TX (US); Ross A. Alaspa, Austin, TX (US); Casey Marshall, San Marcos, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/491,433

(22) Filed: Jan. 26, 2000

(51) Int. Cl.$^7$ .......................... G01R 31/28; G01R 31/26
(52) U.S. Cl. .......................... 714/729; 324/765
(58) Field of Search ................................ 714/724, 726, 714/729

(56) References Cited

U.S. PATENT DOCUMENTS

| | | | | |
|---|---|---|---|---|
| 5,206,582 A | * | 4/1993 | Ekstedt et al. | 324/158.1 |
| 5,717,607 A | * | 2/1998 | Hu | 700/109 |
| 6,138,257 A | * | 10/2000 | Wada et al. | 714/724 |
| 6,145,106 A | * | 11/2000 | Chakradhar et al. | 714/742 |
| 6,167,545 A | * | 12/2000 | Statovici et al. | 324/73.1 |
| 6,367,041 B1 | * | 4/2002 | Statovici et al. | 324/73.1 |

OTHER PUBLICATIONS

"An on–line data collection and analysis system for VLSI devices at wafer probe and final test" by Papadeas et al. Internationa Test Conference , 1994 Proceedings. pp. 771–780, Oct. 2–6, 1994.*

* cited by examiner

*Primary Examiner*—Albert Decady
*Assistant Examiner*—Cynthia Britt
(74) *Attorney, Agent, or Firm*—Joanna G. Chiu; James L. Clingan, Jr.

(57) ABSTRACT

The present invention relates to methods for performing integrated circuit testing and an apparatus therefore including a data analyzer, a test program server, a data storage unit, and testers. One embodiment includes providing a plurality of software switchable test programs and a first plurality of integrated circuits and running the software switchable test programs on the first plurality of integrated circuits. The method further includes collecting and storing data resulting from the test programs and providing a second plurality of integrated circuits where an analyzer program uses the collected and stored data to determine which of the software switchable tests are bypassable tests. In response to running the analyzer program, the test programs are automatically run without the bypassable tests on a first portion of the second plurality of integrated circuits.

22 Claims, 2 Drawing Sheets

METHOD AND APPARATUS FOR TESTING A CIRCUIT

FIELD OF THE INVENTION

The present invention relates to testing circuits, and more specifically, to testing circuits using groups of possibly bypassable tests.

RELATED ART

In the manufacturing of integrated circuits, testing is a required yet time consuming and expensive procedure. This is the case whether testing is performed at wafer level or after assembly. Adequate testing is required to ensure a reliable product. However, unnecessary additional testing increases both overall time to market and manufacturing cost. Current testing methods perform a large amount of unnecessary testing which increases both time to market and cost. Therefore, a need exists to reduce testing time and eliminate unnecessary tests in order to improve processing time and cost while continuously ensuring a reliable product.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Embodiments of the present invention include a testing system and a method for testing integrated circuits that reduces test time by eliminating unnecessary testing automatically (in real time and without human intervention).

Figure 1:
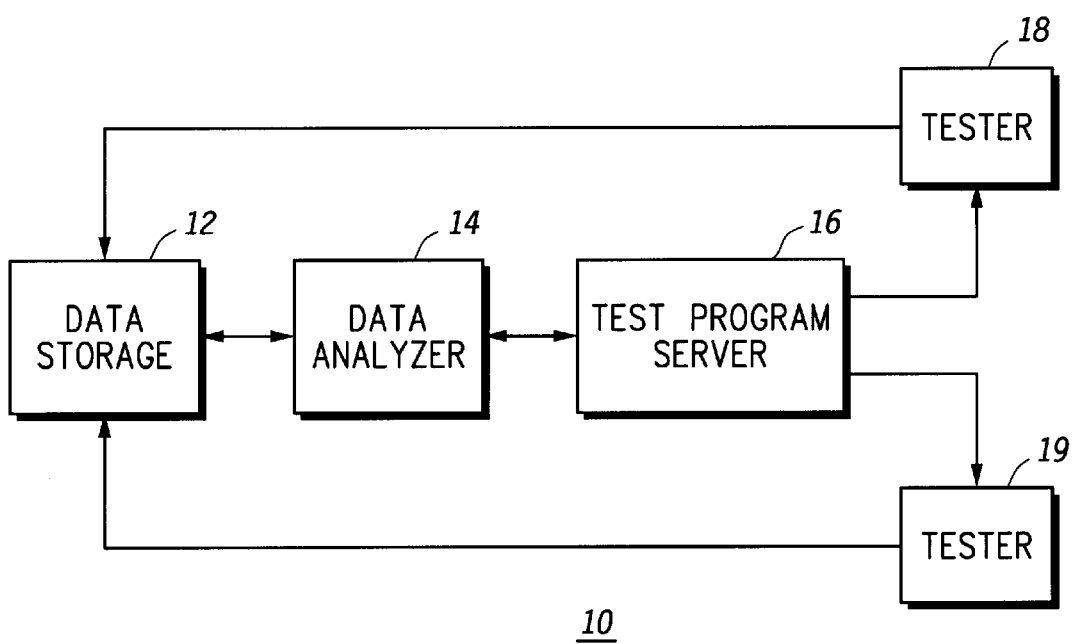
FIG. 1 illustrates, in block diagram form, a testing system in accordance with one embodiment of the present invention.

FIG. 1 illustrates a testing system capable of testing integrated circuits in accordance with one embodiment of the present invention. Testing system 10 includes data storage 12, data analyzer 14, test program server 16, and testers 18 and 19. Data analyzer 14 is bidirectionally coupled to data storage 12 and test program server 16. Testers 18 and 19 are each coupled to test program server 16 and data storage 12. Data storage 12, data analyzer 14, and test program server 16, can each be a separate data processing unit or can all be performed by a single processing unit. In one embodiment, data storage 12 is an Oracle® database for data storage. Data analyzer 14, in one embodiment, is a Unix machine running software, and test program server 16 is a Unix file server capable of communicating with testers 18 and 19. Testers 18 and 19 may be referred to as automatic testing equipment, capable of performing various tests on integrated circuits, whether it be at the wafer level or after assembly. The operation of testing system 10 will be described further in reference to the flow diagram of FIG. 2.

Figure 2:
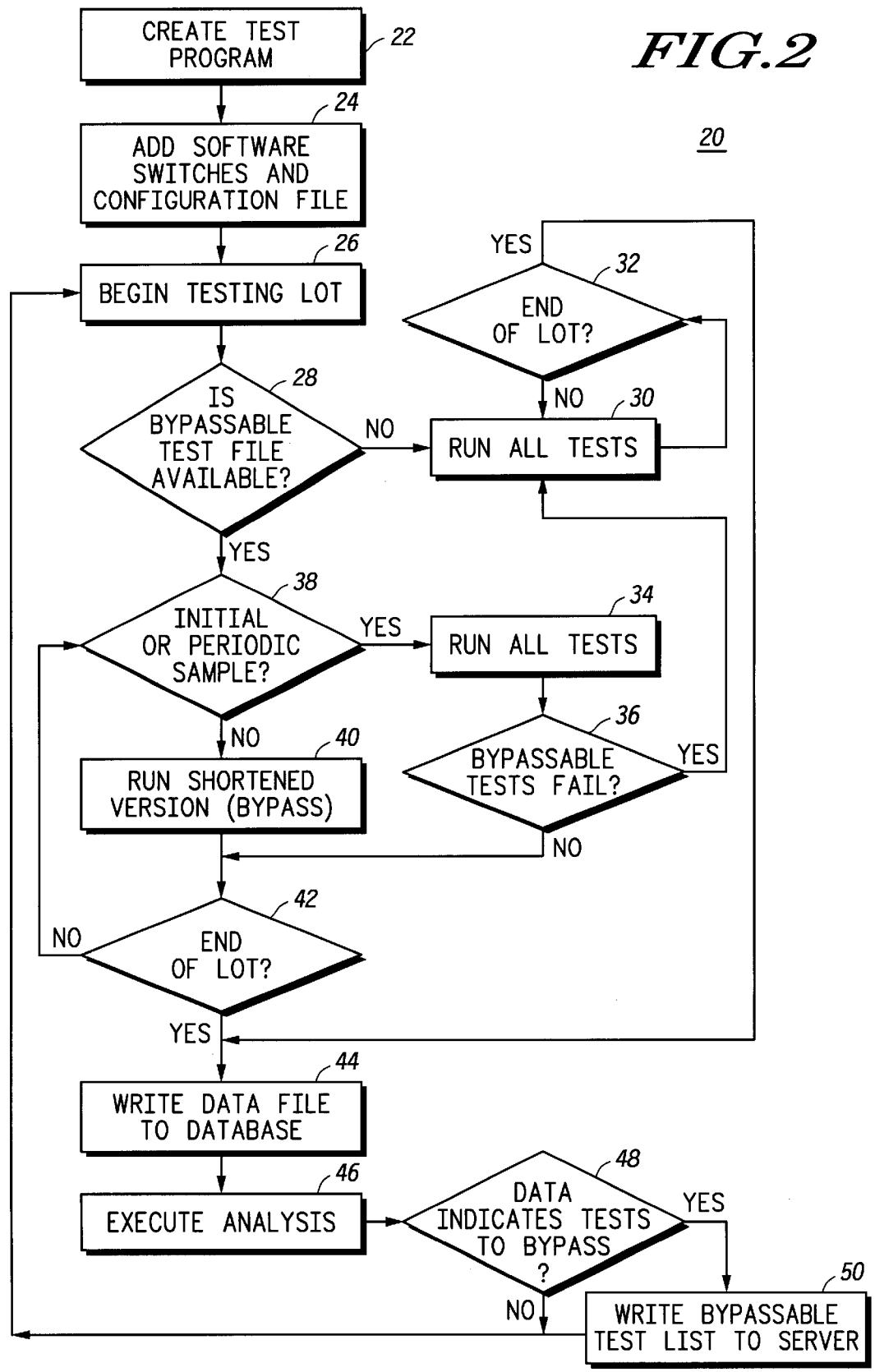
FIG. 2 illustrates, in flow diagram form, a method of testing an integrated circuit in accordance with one embodiment of the present invention.

FIG. 2 illustrates a flow diagram 20 illustrating a method of testing integrated circuits in accordance with an embodiment of the present invention. This method of testing can be performed at different times throughout the processing of integrated circuits, such as at wafer level or after assembly. Flow diagram 20 begins with block 22 where test programs are created. These test programs are programs that are run on the integrated circuits by testers such as testers 18 and 19 of FIG. 1. These test programs can include currently existing test programs that are modified for use in testing system 10 of FIG. 1 or can include test programs that are independently created for testing system 10. These test programs perform a variety of different tests on integrated circuits, depending on the testing system. These test programs generally test to insure that the integrated circuits, devices, or the wafers meet customer specifications.

Once these test programs are created, flow continues to block 24 where software switches are added to these test programs. These software switches enable or disable various testing groups based on output from data analyzer 14 thus creating software switchable testing groups. The software switches may be accomplished through the use of software flags, branching statements, or any other software means that allow the testers to bypass a group of tests. The testing groups refer to groups of tests within the test program that may be bypassed as a group during the testing. In defining these testing groups, various factors are taken into account such as test dependencies, critical tests, and whether certain tests are done individually or simultaneously with others.

Critical tests are those tests that should not be bypassed. This is due to either customer demands or engineering issues that require that these tests be performed. Another consideration, as mentioned above, is test dependencies. In many test programs, some specific tests are dependent upon the measurement of a separate, previous test. For instance, one test may sample a voltage level on one pin, and five subsequent tests sample the voltage level on other pins relative to the first measurement. In this case, it is said that the five subsequent tests are dependent on the first test. This means that the first test may not be bypassed unless each of the tests dependent upon it are also bypassed. Also, in test programs, certain tests are naturally grouped together and some tests are even done simultaneously. For instance, a group of continuity tests may look for shorts on 20 pins at once. In these cases, eliminating a single test has no impact on the test time of the device since other simultaneous tests must still be performed. Therefore, taking these factors into consideration, groups of tests are defined that may be bypassed together.

These software switchable testing groups are defined in a configuration file. This configuration file also defines the minimum analysis required before a bypass test list containing bypassable testing groups can be created. Also defined in the configuration file are parameters used for inside the test program analysis for each lot going through the testing system. These parameters will be discussed below in reference to later steps in the flow. The configuration file also defines the testing groups within the test program and the dependencies among test groups. This configuration file can be set up in a variety of ways depending on the needs of the testing system. Any parameters that may be required while running the testing program can be defined in this configuration file or in a group of files that contain the configuration information. Once the test program is created, the test groups defined, the software switches added, and the configuration file developed, testing may begin at block 26.

Until later analysis when enough data is gathered, lots are tested with the full test program as in blocks 30 and 32. That is, no testing groups are bypassed. After each lot is tested and the resulting data is transferred to the data storage unit 12, a detailed analysis is automatically executed of the new data and preceding data from the same test program. Data analyzer 14 will not mark any tests as bypassable until a certain population sample is reached. This sample size is dependent on the program's flow. For example, if a certain test group is tested for the first time in the test flow specified, data analyzer 14 may use a minimum sample size of the "minimum number of lots" multiplied by the "maximum number of die in a wafer lot" where these values are taken from the configuration file. However, if the test group has been tested previously, then the "minimum number of lots" multiplied by the "maximum number of devices in an assembly lot" may be used instead since less data needs to be accumulated and assembly lots are subsets of wafer lots. These numerical values which are specified in each program's configuration file are provided by someone knowledgeable about the part such as a product engineer, and will vary depending on the device. Therefore, the amount of data (i.e. the minimum sample size) that is sufficient for statistical analysis and creating a bypass test list varies depending on the device being tested, the sensitivity of some devices to certain tests (which may require a larger sample size), or the requirements of the customer or designers.

After sufficient data is collected to perform a satisfactory statistical analysis, data analyzer 14 automatically creates an output file which lists groups of tests, if any, that can be bypassed during the test program. After this bypassable test list file is created containing the bypassable tests, the test program automatically detects this file and runs a new type of flow utilizing this file. This can be better understood in reference to FIG. 2 at decision diamond 28.

Decision diamond 28 detects whether a bypassable test list file is available. If a bypassable test list file is available, this means that enough data has been taken and stored in data storage unit 12 to perform a statistical analysis that results in a bypassable test list file. If this bypassable test list file is not available, then sufficient data has not been taken and flow continues to block 30 where all tests are run. The tests are continued until the end of lot is detected at decision diamond 32. After the lot has been processed, flow continues to block 44 where a data file is written to the database stored in data storage unit 12. This data file contains the data that was accumulated as a result of running the tests in block 30. Once data storage 12 is updated, data analyzer 14 detects this update and performs an analysis in block 46.

Data analyzer 14, in executing its analysis, uses the data stored in data storage 12 and the configuration file created in block 24 to target an allowable failure rate. For example, in one embodiment, the rate of failure used by the analysis application is 3.4 defects per million parts (3.4 PPM), or one part per 294,118 parts tested. In some embodiments, a confidence level may be calculated from this 3.4 PPM ratio and the sample size specified. Multiplying the failure ratio by the sample size and rounding down to the nearest integer gives the maximum number of failures allowed by the tester. For example, in a sample size of 201,579, zero failures are allowed in order to achieve the 3.4 PPM. Likewise, in a sample size of 333,366, one failure would be allowable to achieve this same ratio. Therefore, depending on the sample size defined within the configuration file, various failure counts may be allowed.

If (1) the statistically significant minimum sample size is reached, (2) a test group does not fail more often than the allowable failure rate, and (3) all its dependent test groups can be eliminated as well, then the test group is capable of being bypassed. Furthermore, if there is insufficient data for the minimum sample size, any test that was bypassed in the past is re-enabled if a failure is found. In addition, the analysis performed by data analyzer 14 in block 46 pertains to a particular flow for a particular device on a particular test platform at a particular location. This is because there are different production environments depending upon the production location, and test platforms. Therefore, each different flow, environment, or processing parameters would require a different statistical analysis.

Alternatively, if, within analysis block 46, insufficient data is available to perform the statistical analysis to create a bypassable test list, yet a bypassable test list already existed from previous runs, then in an alternate embodiment, data analyzer 14 may choose to use the bypassable test list already in existence. Data analyzer 14 may choose to remove groups of tests from the bypassable test list; however, no new tests can be added since insufficient data is available to add new groups to the bypassable test list.

Since data analyzer 14 may be a separate unit from test program server 16 and testers 18 and 19, data analyzer 14 may execute its analysis simultaneously while testers 18 and 19 continue to test wafers or devices. This further aids in reducing overall testing time. Once the analysis is complete, and a sufficient sample size has been taken, then the flow at decision diamond 48 continues to block 50 where a bypassable test list file is written to test program server 16. This bypassable test list includes those groups of tests that may be bypassed in the subsequent lot to be tested. Also, the corresponding software switches within the test program are set accordingly to allow these tests to be bypassed by the testers. This bypassable test list is automatically created in response to the analysis performed by data analyzer 14 in block 46. Once the bypassable tests are listed in the bypassable test list file, the test program automatically detects this file and knows to run a new type of flow. This new type of flow, as will be discussed in reference to decision diamond 38 and block 40, automatically bypasses those tests in the bypassable test list in order to save valuable testing time. Therefore, the bypassable test list allows for reduced testing time and lower production costs.

As was mentioned above, each time a new lot is being tested at block 26, a check is performed to determine if a bypassable test list file is available. As was discussed above, if no bypassable test list file was available, then insufficient data has been taken for statistical analysis and all tests would be performed at block 30. However, if a bypassable test list file is available, then flow continues to decision diamond 38 where it is determined whether the particular device being tested falls under an initial testing interval or within a periodic testing sample. For each lot which has a bypassable test list file available, there are certain periods throughout the lot's testing where the full tests will be run. The full tests will be run during the first portion of the lots, and at a specified sample rate throughout the lot. The full tests run during the initial portion of each lot provides more complete data to data analyzer 14 for each specific lot since each lot is manufactured differently and thus may vary some from lot to lot. The full tests run during the sample periods ensures that those tests that were bypassed should continue to be bypassed. That is, if during one of those times when all tests are run, a failure occurs in one of the bypassed tests, the bypassed list is disabled and all tests are performed for the remainder of the lot. Furthermore, if the failure in the bypassed test causes it to surpass its allowable failure rate, then it will be removed from the bypassable test list prior to testing the next lot.

If the device being tested does not fall into this initial or periodic sample where all tests must be run, flow continues to block 40 where a shortened version of the test program is run. This shortened version bypasses those test groups listed in the bypass test list. If there are more devices to be tested within the lot after the shortened version of the test is run, then at decision diamond 42, flow will return to decision diamond 38 where the testing on that lot continues. If the device at decision diamond 38 does fall into the initial or periodic sample, then all tests are performed at block 34.

At decision diamond 36, an analysis is run to determine whether a bypassed test failed. If upon running all tests at block 34, any bypassable tests failed, then the tester is returned to full testing mode and all tests are run for the remainder of the lot as illustrated by block 30. However, if all tests are run during the initial or periodic sample at block 34 and no bypassable test fails, then flow will continue from decision diamond 36 to decision diamond 42 where the remainder of the lot will continue to be tested as was described above. So long as the next device does not fall into the initial or periodic sample, the shortened version of the tests will be run. Once the end of the lot is reached at decision diamond 42, flow will return to block 44 where the data file containing the test results is written to the database within data storage unit 12.

Once more, data analyzer 14 determines that an update was written to data storage 12 and automatically begins to execute its analysis in response to detecting the update. By detecting when the data storage unit 12 is updated with the new test results, data analyzer 14 can execute its analysis automatically and in real time. Once again, the same analysis as described above is performed. Depending on the results of the new analysis, the bypassable test list file is updated where, if a bypassable test failed and surpassed the allowable failure rate, then it is removed from the bypass test list. In the event that sufficient data was taken on another group of tests, then this group may be added to the bypassable test list for the next lot. A removed bypassable test may be added again later if enough data is taken and it is determined through statistical analysis that it may be bypassed once more. Flow then continues to block 26 where a next lot is tested.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for performing circuit testing, comprising:
running a plurality of tests on a first plurality of circuits;
storing data relative to the tests run on the first plurality of circuits;
determining from the stored data which of the plurality of tests are bypassable tests;
providing a second plurality of circuits; and
automatically bypassing the bypassable tests in testing a first portion of the second plurality of circuits;
running the bypassable tests on a second portion of the second plurality of circuits; and
after detecting a failure of at least one of the bypassable tests, running the plurality of tests, including all the bypassable tests, on all remaining untested circuits of the second plurality of integrated circuits.

2. The process of claim 1, wherein the first plurality of circuits comprises a plurality of lots, each lot comprising a plurality of circuits, and wherein the second plurality of circuits is in a subsequent lot.

3. The process of claim 2, further comprising:
prior to automatically bypassing the bypassable tests in testing a first portion of the second plurality of circuits, running the bypassable tests on a third portion of the second plurality of circuits.

4. The process of claim 3, wherein the bypassable tests are determined to be bypassable based on a failure rate not greater than 3.4 parts per million.

5. The process of claim 1, wherein the step of determining from the stored data which of the plurality of tests are bypassable tests occurs immediately after and in response to the storing of data.

6. The process of claim 1, wherein the bypassable tests are determined to be bypassable based on a failure rate not greater than 3.4 parts per million.

7. An apparatus for testing circuits, comprising:
a tester, wherein the tester executes a plurality of tests;
a data storage unit, coupled to the tester, for storing information generated from the tester;
a data analyzer, coupled to the data storage unit and the test program server, which generates, in response to storing information in the data storage unit, a list of tests, selected from the plurality of tests, which are to be bypassed; and
a test program server, coupled to the tester and the data analyzer, for automatically providing the plurality of tests and a list of the bypassable tests to the tester;
wherein the tester bypasses the bypassable tests except for periodically testing with the bypassable tests, and in response to detecting a failure of a bypassable test, the tester uses all of the plurality of tests, including the bypassable tests.

8. The apparatus of claim 7, wherein the tester tests an initial portion of a first plurality of integrated circuits with the bypassable tests and a subsequent portion of the first plurality of integrated circuits without the bypassable tests.

9. The apparatus of claim 7, wherein the tester tests an initial portion of a first plurality of circuits with the bypassable tests and if (i) a failure is detected, continuing using the bypassable tests for all remaining untested circuits in the first plurality of circuits and (ii) no failure is detected, bypassing the bypassable tests.

10. A completed circuit tested by the following method:
providing a plurality of software switchable tests inside a test program;
providing a first lot comprising a plurality of circuits;
running the plurality of software switchable tests on the first lot;
collecting and storing data resulting from running the plurality of software switchable tests on the first lot;

running an analyzer program using the collected and stored data to determine which of the plurality of software switchable tests are bypassable tests;

providing a second lot comprising the completed circuit; and in response to running the analyzer program, automatically running the software switchable tests without the bypassable tests on the completed integrated circuit.

11. A process for performing circuit testing, comprising:

testing a plurality of lots wherein each lot comprises a plurality of circuits and testing comprises:
running a plurality of software switchable tests on each circuit in each lot in the plurality of lots; and
after completing testing of each lot in the plurality of lots, storing resulting data to a storage unit and analyzing the resulting data to determine which of the plurality of software switchable tests are bypassable tests;

receiving a next lot; and running the plurality of software switchable tests without the bypassable tests on a first portion of the next lot.

12. The process of claim 11, further comprising:

prior to running the plurality of software switchable tests without the bypassable tests on the first portion of the next lot, running the plurality of software switchable tests, including the bypassable tests, on a second portion of the next lot, wherein the bypassable test determinations are not modified prior to testing the first portion of the next lot.

13. The process of claim 12, further comprising:

determining if any of the bypassable tests run on the second portion failed;

in response to determining a failure of a bypassable test ran on the second portion, running the plurality of software switchable tests, including the bypassable tests, on all remaining untested circuits in the next lot.

14. A process for performing circuit testing, comprising:

selectively creating a bypassable test list in response to analyzing resulting data from a plurality of tests run on a first plurality of circuits, wherein the bypassable test list comprises a subset of the plurality of tests;

after selectively creating the bypassable test list, providing a second plurality of circuits;

determining whether a bypassable test list has been created;

in response to determining that a bypassable test list has been created, testing the second plurality of circuits using the bypassable test list, wherein testing the second plurality of circuits comprises:
running the plurality of tests, excluding tests on the bypassable test list, on a first portion of the second plurality of circuits; and
running all of the plurality of tests, including the tests on the bypassable test list, on a second portion of the second plurality of circuits.

15. The process of claim 14, further comprising determining if any of the tests on the bypassable test list failed on the second portion of the second plurality of circuits; and in response to determining that any of the bypassable tests failed on the second portion of the second plurality of circuits, running all of the plurality of tests, including the tests on the bypassable test list, on any remaining untested circuits of the second plurality of circuits.

16. The process of claim 14, further comprising not modifying the bypassable test list during testing the second plurality of circuits.

17. The process of claim 16, further comprising:

after completing testing of the second plurality of circuits, selectively modifying the bypassable test list prior to providing a third plurality of circuits.

18. The process of claim 14, wherein the first plurality of circuits comprise a plurality of lots, and the second plurality of circuits are in a subsequent lot different from any of the plurality of lots.

19. The process of claim 14, wherein in response to determining that a bypassable test list has not been created, running all the plurality of tests on all circuits in the second plurality of circuits.

20. A process for performing circuit testing, comprising:

creating a bypassable test list based on resulting data for a plurality of tests run on a first plurality of circuits, wherein the bypassable test list comprises a subset of the plurality of tests;

testing a second plurality of circuits, different from the first plurality of circuits, using the bypassable test list, wherein testing comprises running the plurality of software switchable tests without tests in the bypassable test list on the second plurality of circuits except for periodically testing with the tests in the bypassable test list at least a portion of the second plurality of circuits, wherein the bypassable test list is not modified during testing the second plurality of circuits, and wherein during testing the second plurality of circuits, if a failure of any test in the bypassable test list is detected, any remaining untested circuits in the second plurality of circuits is tested with the tests in the bypassable test list.

21. The process of claim 20, further comprising, after creating the bypassable test list, receiving a first lot, the first lot comprising the second plurality of circuits.

22. The process of claim 20, further comprising:

after testing the second plurality of circuits, selectively modifying the bypassable test list prior to testing a third plurality of circuits.

* * * * *

UNITED STATES PATENT AND TRADEMARK OFFICE
CERTIFICATE OF CORRECTION

PATENT NO. : 6,532,559 B1  Page 1 of 1
DATED : March 11, 2003
INVENTOR(S) : Chung V. Pham et al.

It is certified that error appears in the above-identified patent and that said Letters Patent is hereby corrected as shown below:

Column 7,
Line 35, change "ran" to -- ran --

Signed and Sealed this

Twenty-third Day of September, 2003

JAMES E. ROGAN
*Director of the United States Patent and Trademark Office*